United States Patent [19]
Jamison

[11] 3,952,262
[45] Apr. 20, 1976

[54] BALANCED SIGNAL PROCESSING CIRCUIT

[75] Inventor: Richard S. Jamison, Los Angeles, Calif.

[73] Assignee: Hughes Aircraft Company, Culver City, Calif.

[22] Filed: Apr. 1, 1974

[21] Appl. No.: 456,716

[52] U.S. Cl. .................................. 331/55; 330/53; 330/57; 331/107 R; 333/84 M
[51] Int. Cl.² .......................................... H03B 3/06
[58] Field of Search ................... 330/53, 61, 56, 57; 333/11, 10, 84 M; 331/107, 55

[56] References Cited
UNITED STATES PATENTS

| | | | |
|---|---|---|---|
| 2,950,451 | 8/1960 | Custin | 333/11 |
| 3,221,276 | 11/1965 | Stern | 333/11 |
| 3,416,042 | 12/1968 | Thomas et al. | 333/11 |
| 3,451,005 | 6/1969 | Skullestad | 330/53 |
| 3,678,415 | 7/1972 | Kuroda | 333/11 |
| 3,729,692 | 4/1973 | Tanaka | 333/11 |

FOREIGN PATENTS OR APPLICATIONS
680,490   2/1964   Canada............................ 330/61 A OTHER PUBLICATIONS
Ire Trans. on Microwave Theory and Techniques, C. Y. Pon, Nov. 1961 pp. 529–534.
IEEE Jour. of Solid–State Circuits Vol. SC–5, No. 6, Dec. 1970, pp. 354–358.

*Primary Examiner*—John Kominski
*Attorney, Agent, or Firm*—John Holtrichter, Jr.; W. H. MacAllister, Jr.

[57] ABSTRACT

The invention utilizes a four-port hybrid junction in which a signal to be amplified or a low level stable reference signal is coupled to a first port in which a pair of similar or matched amplifiers or oscillators are coupled to the respective second and third ports of the hybrid, and in which the resulting amplified or coherent stabilized power of the two amplifiers or oscillators is provided at the fourth port of the hybrid junction.

1 Claim, 3 Drawing Figures

3,952,262

BALANCED SIGNAL PROCESSING CIRCUIT

BACKGROUND OF THE INVENTION

The background of the invention will be set forth in two parts.

1. Field of the Invention

This invention relates to electromagnetic wave generating and amplifying systems, and more particularly to electronic circuitry for transmitting signals from balanced amplifiers or stabilized signal oscillators.

2. Description of the Prior Art

In certain applications, it is desirable to utilize a stable but relatively small injection signal to injection lock (stabilize) two oscillators such as IMPATT diode oscillators, BWO's and klystrons, to provide a very stable and relatively high power output signal. In other applications, it has been found to be desirable to provide an amplified high frequency output signal derived from a pair of matched amplifiers to which is coupled a lower power input signal. For example, it may be desirable to provide a microminiature microwave source of power for use in advanced radar, space and communication systems.

In the past, it has been the long-established practice to use directional couplers or ferrite circulators for injecting the reference signal into and coupling the output signal from a single oscillator. The ferrite circulator scheme requires the use of relatively heavy and bulky magnets, and the directional coupler technique requires a relatively large injection signal. It should therefore be evident that an efficient, convenient, lightweight and compact means for inserting a low level stable reference or input signal to a pair of oscillators or amplifiers, and also for coupling and combining the output energy from these two devices to an output terminal would constitute a significant advancement of the art.

SUMMARY OF THE INVENTION

In view of the foregoing factors and conditions characteristic of the prior art, it is a primary object of the present invention to provide a new and improved balanced amplifier or injection locked oscillator.

Another object of the present invention is to provide an efficient, lightweight, and compact system that injects a relatively small reference signal to a pair of matched oscillators and which also combines and couples the high frequency electrical energy generated by the injection locked oscillators to an output terminal.

Still another object of the present invention is to provide an efficient, lightweight and compact system that couples a relatively low level input signal to a pair of matched oscillators and which also combines and couples the amplified signal energy from the oscillators to an output terminal.

Yet another object of the present invention is to provide a balanced amplifier or injection locked oscillator system which utilizes a branch line hybrid coupler coupled to the input, output and to a pair of matched active signal processing devices such as oscillators and amplifiers.

In accordance with an embodiment of the present invention, a signal processing circuit is provided including a four-port hybrid junction with first and fourth ports adapted to respectively receive and transmit electromagnetic energy, the received energy being transferred substantially entirely and equally to second and third ports of the hybrid junction but the energy transferred to the third port lagging that transferred to the second port by 90°. Also included are matched first and second active signal processing devices responsive to the received energy in a fixed phase relationship and respectively operatively coupled to the second and third ports, the first active device providing to and substantially entirely transferring through the hybrid junction a first processed signal equally to the first and fourth ports but the processed signal transferred to the fourth port lagging that transferred to the first port by 90°. The second active device provides to and substantially entirely transferring through the hybrid junction a second processed signal equally to the first and fourth ports but the processed signal transferred to the first port lagging that transferred to the fourth port by 90°, whereby the processed signals transferred to the first port are substantially 180° out of phase and cancel while the processed signals transferred to the fourth port are in phase and constitute output energy having a magnitude substantially the sum of the processed signal when the processed signals are of equal magnitude and the second processed signal lags the first processed signal in phase by 90°. In different embodiments of the invention, the active signal processing devices may be either oscillators or amplifiers, and the hybrid junction may be of the branch line type.

The features of the present invention which are believed to be novel are set forth with particularity in the appended claims. The present invention, both as to its organization and manner of operation, together with further objects and advantages thereof, may best be understood by making reference to the following description taken in conjunction with the accompanying drawing, in which like reference characters refer to like elements in the several views.

DESCRIPTION OF THE PREFERRED EMBODIMENTS

Figure 1:
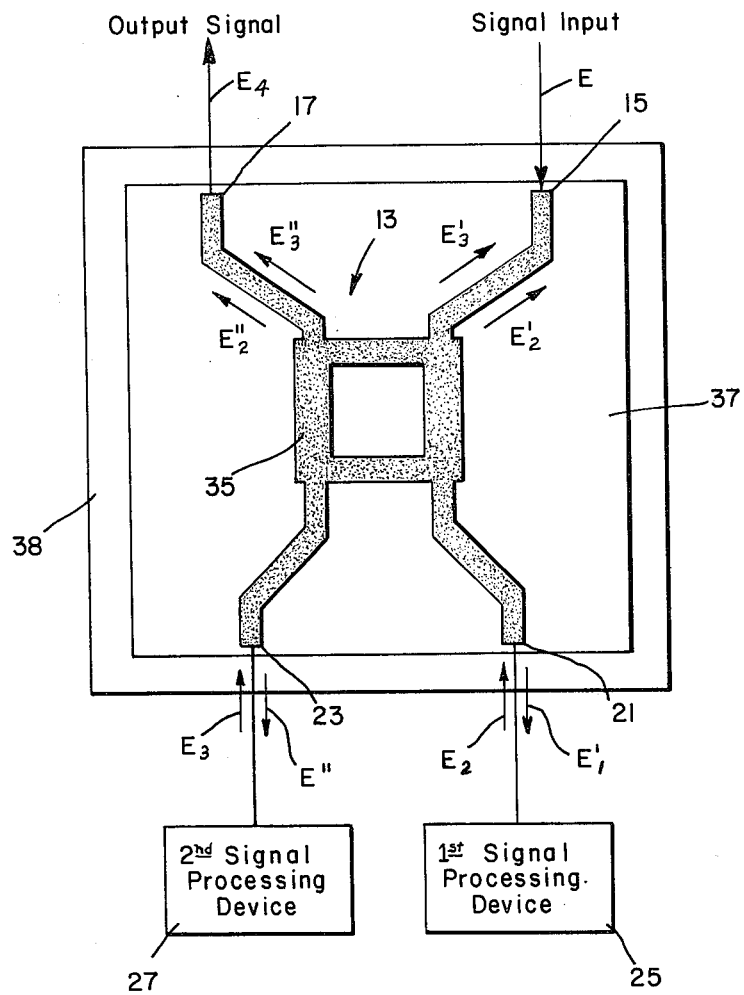
FIG. 1 is a plan view of a balanced signal processing circuit in accordance with the present invention.

Referring now to FIG. 1, there is shown schematically a balanced signal processing circuit 11 including a 90° four port hybrid junction 13 with first and fourth ports 15 and 17, respectively, adapted to receive and transmit energy. As will be analyzed later, the received energy E is transferred from the first port 15 substantially entirely and equally to second and third ports 21 and 23 of the hybrid junction, but the energy $E''$ transferred to the third port 23 lags the energy $E'$ transferred to the second port 21 by 90°. Matched first and second active signal processing devices 25 and 27, responsive to the received energy in a fixed phase relationship, are respectively operatively coupled to the second and third ports 21 and 23, the first active device 25 providing to and substantially entirely transferring through the hybrid junction 13 a first processed signal $E_2$ equally to the first and fourth ports 15 and 17 but the processed signal $E_2''$ transferred to the fourth port 17 lagging the energy $E_2'$ transferred to the first port 15 by 90°. The second active device 27 provides to and substantially entirely transfers through the hybrid junction 13 a second processed signal $E_3$ equally to the first and fourth ports 15 and 17, but the processed signal $E_3'$ transferred to the first port 15 lags the signal $E_3''$ transferred to the fourth port 17 by 90°. In this manner, the processed signals $E_2'$ and $E_3'$ transferred to the first port 15 are substantially 180° out of phase and cancel, while the processed signals $E_2''$ and $E_3''$ transferred to the fourth port 17 are in phase and constitute the output signal $E_4$ having a magnitude substantially the sum of the processed signals $E_2$ and $E_3$ with the processed signals are of equal magnitude and the second processed signal $E_3$ lags in phase the first processed signal $E_2$ by 90°.

Figure 2:
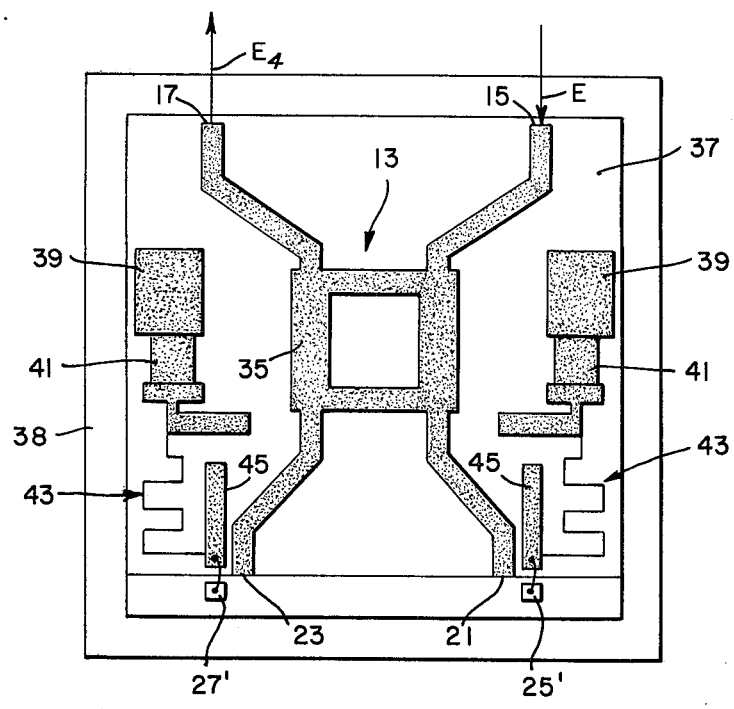
FIG. 2 is a plan view of a presently preferred embodiment of the present invention.

The hybrid junction 13 may be of any type having four ports and functioning as the ones described herein. For example, the junction may be branched line hybrid junction in the form of a conductive layer 35 deposited on a ceramic substrate 37 carried by an outer casing 38, as shown in FIGS. 1 and 2. The active signal processing devices may be a matched pair of any conventional oscillators capable of locking to a relatively small stabilizing injection signal. For example, FIG. 2 illustrates an embodiment 11' of the invention adapted for operation at X-band and utilizing a pair of IMPATT diodes 25' and 27' which require an appropriate DC bias potential for proper operation. The bias for each diode is provided, in this embodiment, by conventional similar DC bias signal sources 39 through deposited bias resistors 41 and ¾λ high impedance meander lines 43. In this form, the entire circuit may be only approximately 0.700 inch square.

The second and third ports 21 and 23 in FIG. 2 are shown capacitively coupled to coupling strips 45 and the diodes 25' and 27' in order to isolate the DC bias voltages. However, it should be clear that where such isolation is not required, these ports may be conductively connected directly to the active signal processing device.

An analysis of the circuit 11 in term of voltage vectors will reveal that $E'$ at the second port 21 equals $E/\sqrt{2} <0°$ (no shift in phase), while $E''$ at the third port 23 equals $E/\sqrt{2} <-90°$, a shift of 90°. Again because of the characteristic of the 90° four port hybrid junction 13, and because of the locked phase relationship between the processed signals and the input signal, the processed signal $E_2'$ at the first port 15 is equal to $E_2/\sqrt{2} <0°$, while the signal $E_2''$ from the same device 25 at the fourth port 17 is equal to $E_2/\sqrt{2} <-90°$. An analysis will also reveal that at the first port 15, the processed signal $E_3'$ from the second device 27 is equal to $E_3/\sqrt{2} <-180°$ (a shift of −90° due to the signal propagating from the third port to the first port in addition to the −90° phase angle of the signal $E_3$ at the third port), and the processed signal $E_3''$ at the fourth port 17 is equal to $E_3/\sqrt{2} <-90°$ since there is no shift in phase in a signal propagating from the third port 23 to the fourth port 17. Thus, the energy from the two devices 25 and 27 propagating toward the first port 15 will be of equal magnitude (these devices being designed to produce signals $E_2$ and $E_3$ of essentially equal magnitude, but will have a phase, respectively, of 0° and −180°. Accordingly, these signals cancel each other and none of the energy from the two devices 25 and 27 will appear at the first port 15.

However, energy from these devices transferred by the hybrid junction 13 to the fourth port 17 will be in phase (both at −90° with respect to the input signal E) and will add in magnitude. Thus, $E_4 = E_2''/\sqrt{2} <-90° + E_3/\sqrt{2} <-90°$, but since $|E_2''|=|E_3''|$, then $E_4 = 2E_2''/\sqrt{2} <-90°$ and $E_4^2 = P_o = 2(E_2'')^2$.

Figure 3:
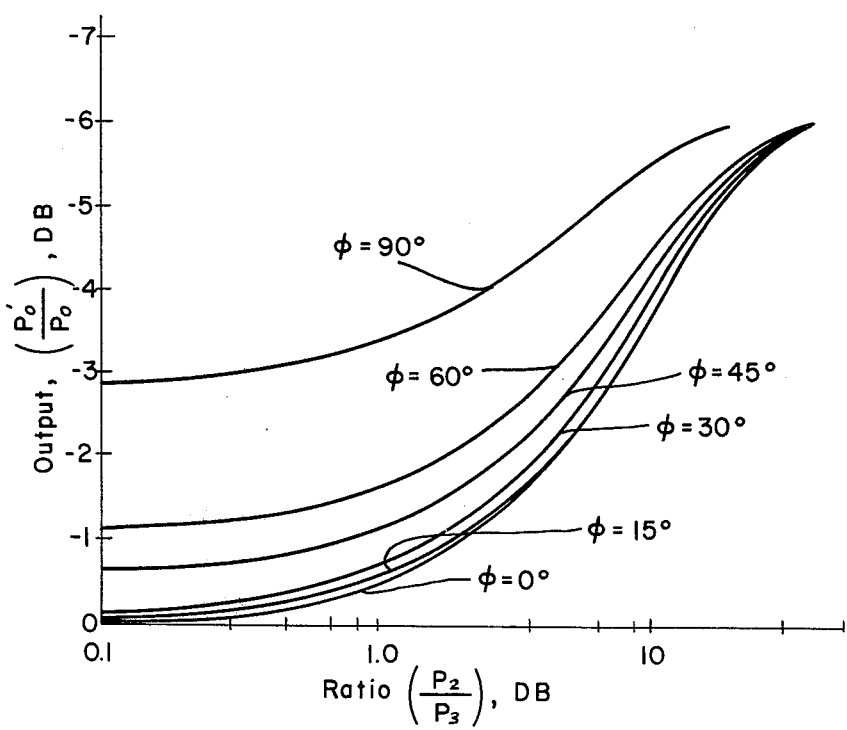
FIG. 3 is a graphical representation of the power output of an injection locked balanced signal processing circuit with respect to unbalance in phase and power of a pair of injection stabilized oscillators.

Taking into consideration that in a practical situation, the signal processing devices 25 and 27 cannot always be perfectly matched, FIG. 3 illustrates the degradation of the output power ($P_o$) by a mismatching of the phase and power relationships. In the graph, $P_2$ is the power delivered to the hybrid 13 by the first device 25 and $P_3$ is the power delivered to the second device 27. Ideally, $P_o$ is maximum $P_2$ equals $P_3$ and the phase error, $\phi$, is zero. The graph shows the condition where $P_3 \leq P_2$ and $\phi \geq 0$, as derived from empirical data.

The active signal processing devices 25 and 27 of FIG. 1 may also be matched amplifiers that equally amplify the input signal E to provide an output signal $E_4$ equal in magnitude to the sum of the amplified signals from the two amplifiers.

From the foregoing, it should be evident that there has herein been described a balanced signal processing circuit that obviates the use of complicated directional couplers and ferrite circulators and is simple to construct and provides convenient input and output connections, and also which allows maximum use of printed circuit (microstrip) techniques. The invention further allows the use of a smaller injection signal in a balanced oscillator configuration useful in advanced radar, space and communication systems.

It should also be understood that the materials and components used in the fabrication of the various embodiments of the invention are not critical and any material and component exhibiting similar desired characteristics may be substituted for those mentioned. For example backward wave oscillators and klystrons may be substituted for the IMPATT diodes 25 and 27 shown, and the 90° hybrid junction 13 may be a waveguide hybrid, a stripline hybrid, a coaxial hybrid, etc.

Although the present invention has been shown and described with reference to particular embodiments, it should be realized that various changes and modifications which are obvious to persons skilled in the art to which the invention pertains are deemed to lie within the spirit, scope and contemplation of the invention.

What is claimed is:

1. A balanced injection locked IMPATT oscillator, comprising:
    a four-port branch line hybrid junction disposed on a substrate with first and fourth ports adapted to respectively receive and transmit electromagnetic energy, said received energy being transferred entirely and equally to second and third ports of said hybrid junction but said energy transferred to said third port lagging that transferred to said second port by 90°;
    matched first and second IMPATT diode oscillators responsive to and injection locked by said received energy and respectively capacitively coupled to said second and third ports and each diode respectively generating and coupling to said hybrid junction signal energy effectively present only at said fourth port;
    DC bias voltage source means disposed on said substrate, said means including similar deposited DC bias sources and deposited bias resistors coupled respectively to each of said diodes;
    and isolation means including a ¾λ high impedance meander line for coupling each of said bias source/resistor combinations to an associated one of said diodes.

* * * * *